(12) United States Patent
Trauernicht (10) Patent No.: US 9,419,546 B2
(45) Date of Patent: Aug. 16, 2016

(54) PIEZOELECTRIC ENERGY HARVESTER DEVICE WITH FREQUENCY OFFSET VIBRATIONAL HARVESTERS

(71) Applicant: MicroGen Systems, Inc., West Henrietta, NY (US)

(72) Inventor: David Trauernicht, Rochester, NY (US)

(73) Assignee: MicroGen Systems, Inc., West Henrietta, NY (US)

( * ) Notice: Subject to any disclaimer, the term of this patent is extended or adjusted under 35 U.S.C. 154(b) by 118 days.

(21) Appl. No.: 14/260,930

(22) Filed: Apr. 24, 2014

(65) Prior Publication Data

US 2015/0311826 A1     Oct. 29, 2015

(51) Int. Cl.
| | |
|---|---|
| *G01L 9/00* | (2006.01) |
| *H02N 2/18* | (2006.01) |
| *G01L 17/00* | (2006.01) |
| *B60C 23/04* | (2006.01) |
| *H01L 41/113* | (2006.01) |

(52) U.S. Cl.
CPC ............ *H02N 2/188* (2013.01); *B60C 23/0411* (2013.01); *G01L 17/00* (2013.01); *H01L 41/1136* (2013.01); *H02N 2/181* (2013.01)

(58) Field of Classification Search
CPC .............................. G01L 19/0084; G01L 7/00
USPC ............. 73/753, 700; 310/319, 321; 29/25.35
See application file for complete search history.

(56) References Cited

U.S. PATENT DOCUMENTS

| | | | |
|---|---|---|---|
| 4,445,256 A | 5/1984 | Huguenin et al. | |
| 5,248,912 A | 9/1993 | Zdeblick et al. | |
| 5,646,583 A | 7/1997 | Seabury et al. | |
| 6,396,201 B1 | 5/2002 | Ide et al. | |
| 6,796,011 B2 | 9/2004 | Takeuchi et al. | |
| 6,858,970 B2 | 2/2005 | Malkin et al. | |
| 7,919,345 B1* | 4/2011 | Kirsten | ................... C23C 16/24 438/488 |
| 8,080,920 B2 | 12/2011 | Andosca et al. | |
| 8,319,402 B1 | 11/2012 | Churchill et al. | |
| 2004/0115711 A1 | 6/2004 | Su et al. | |
| 2005/0134149 A1 | 6/2005 | Deng et al. | |
| 2007/0125176 A1 | 6/2007 | Liu | |
| 2009/0200896 A1* | 8/2009 | Morris | ................... H02N 2/188 310/321 |
| 2009/0284102 A1 | 11/2009 | Karakaya et al. | |

(Continued)

OTHER PUBLICATIONS

International Search Report for International Patent Application No. PCT/US2014/035318 (Dec. 31, 2014).

(Continued)

*Primary Examiner* — Lisa Caputo
*Assistant Examiner* — Nigel Plumb
(74) *Attorney, Agent, or Firm* — LeClairRyan, a Professional Corporation (57) ABSTRACT

The present invention relates to an energy harvester device comprising a plurality of elongate resonator beams. The resonator beams include a piezoelectric material extending between first and second ends. One or more bases are connected to the first end of each of the resonator beams, with the second end of the resonator beams being freely extending from the one or more bases as a cantilever. A mass is attached to each of the second ends of the resonator beams. Each of the resonator beams is tuned to a resonant frequency offset relative to each of the other resonator beams by 0.1/W to 0.9/W, wherein W is a temporal width between a first impulse and a second impulse which excite motion of the resonator beams. Also disclosed is a system comprising an apparatus and the energy harvester device, as well as methods of using and designing the system.

39 Claims, 5 Drawing Sheets

(56) References Cited

U.S. PATENT DOCUMENTS

| | | | |
|---|---|---|---|
| 2010/0019623 | A1 | 1/2010 | Yao et al. |
| 2010/0072759 | A1 | 3/2010 | Andosca et al. |
| 2010/0194240 | A1 | 8/2010 | Churchill et al. |
| 2011/0264293 | A1* | 10/2011 | Forrest ............... H02J 7/35 700/295 |
| 2011/0277286 | A1 | 11/2011 | Zhang |
| 2011/0309618 | A1 | 12/2011 | Gieras et al. |
| 2012/0049694 | A1 | 3/2012 | Van Schaijk et al. |
| 2013/0088123 | A1 | 4/2013 | Haskett |
| 2013/0341936 | A1* | 12/2013 | Wood ................ H02N 2/188 290/1 R |
| 2014/0265726 | A1* | 9/2014 | Andosca ........... H01L 41/1136 310/314 |

OTHER PUBLICATIONS

Altena G., et al., "Design improvements for an electret-based MEMS vibrational electrostatic energy harvester", Journal of Physics: Conference Series 476 (2013) 012078, PowerMEMS2013, pp. 371-374, IOP Publishing.

Andosca R., et al., "Experimental and theoretical studies on MEMS piezoelectric vibrational energy harvesters with mass loading", Sensors and Actuators A: Physical, 2012, pp. 1-12, Elsevier B.V.

Beeby et al., "Energy harvesting vibration sources for microsystems applications," Meas. Sci. Technol., Measurement Science and Technology, 2006, pp. R175-R195, IOP Publishing Ltd.

Elfrink R., et al., "Vaccum Packaged MEMS Piezoelectric Vibration Energy Harvester", PowerMEMS, 2009, pp. 67-70.

Gu L., et al., "Impact-driven, frequency up-converting coupled vibration energy harvesting device for low frequency operation", Smart Mater, Struct., 20, Mar. 8, 2011, pp. 1-10, IOP Publishing.

Marzencki, M., et al., "A MEMS Piezoelectric Vibration Energy Harvesting Device", PowerMEMS, Nov. 28-30, 2005, pp. 45-48.

Renaud M., et al., "Optimum power and efficiency of piezoelectric vibration energy harvesters with sinusoidal and random vibrations", J. Micromech, Microeng. 22, Sep. 10, 2012, pp. 1-13, IOP Publishing.

Schroder C., et al., "Wafer-Level Packaging of ALN-Based Piezoelectric Micropower Generators", PowerMEMS, Dec. 2-5, 2012, pp. 343-346.

Schroder C., et al., "ALN-Based Piezoelectric Micropower Generator for Low Ambient Vibration Energy Harvesting", 2011,pp. 1-4.

Singh K., et al., "Piezoelectric vibration energy harvesting system with an adaptive frequency tuning mechanism for intelligent tires", Mechatronics 22, Jul. 31, 2012, pp. 970-988, Elsevier, Ltd.

Stoppel et al., "A1N-Based piezoelectric micropower generator for low ambient vibration energy harvesting," Porcedia Engineer. 25, Sep. 4-7, 2011, pp. 721-724, Elsevier, Ltd.

Tang L., et al., "Toward Broadband Vibration-based Energy Harvesting", Journal of Intelligent Material Systems and Structures, vol. 21, Dec. 2010, pp. 1867-1897, Sage Publications.

Schaijk, R., et al., "A MEMS vibration energy harvester for automotive applications", Proc. of SPIE vol. 8763, 2013, pp. 1-10.

Wang Z., et al., "Shock Reliability of Vacuum-Packaged Piezoelectric Vibration Harvester for Automotive Application", Journal of Microelectromechanical Systems, vol. 23, No. 3, Jun. 2014, pp. 539-548, IEEE.

Zhu D., et al., "Strategies for increasing the operating frequency range of vibration energy harvesters: a review", Meas. Sci. Technol. 21, Dec. 15, 2010, pp. 1-29, IOP Publishing.

International Search Report for International Patent Application No. PCT/US2014/014797 (May 23, 2014).

International Search Report for International Patent Application No. PCT/US2013/78520 (May 4, 2014).

International Search Report, corresponding to PCT/US14/65628, mailed Jul. 24, 2015.

International Search Report for International Patent Application No. PCT/US2014/021905 (Aug. 15, 2014).

International Search Report for International Patent Application No. PCT/US2014/035296 (Aug. 22, 2014).

* cited by examiner

PIEZOELECTRIC ENERGY HARVESTER DEVICE WITH FREQUENCY OFFSET VIBRATIONAL HARVESTERS

FIELD OF THE INVENTION

The present invention relates to a piezoelectric energy harvester device with frequency offset vibrational harvesters, a system comprising the device, and methods of using and designing the system.

BACKGROUND OF THE INVENTION

Vibrational energy harvester devices offer electrical power generation in environments that lack light, temperature differentials, and/or pressure differentials. Instead, vibrations, and or movements, e.g., emanating from a structural support, which can be in the form of either a vibration at a constant frequency, or an impulse vibration containing a multitude of frequencies can be scavenged (or harvested) to convert movement (e.g., vibrational energy) into electrical energy. One particular type of vibrational energy harvester utilizes resonant beams freely extending from a base as a cantilever that incorporate a piezoelectric material that generates electrical charge when strained during resonance of the beams caused by ambient vibrations (driving forces), such as that described in U.S. patent application Ser. No. 14/173,131 to Vaeth et al.

Improvements are needed in the energy harvesting capabilities of such devices in systems which receive multiple impulses. In particular, cantilever based piezoelectric vibrational energy harvesters include a resonator beam that has an inherent resonant frequency. The resonator beam may be excited to vibrate at the inherent resonant frequency by a short acceleration impulse. Additional impulses applied to the vibrational energy harvester may either enhance or suppress the motion of the resonator beam, depending on the timing of the subsequent impulses relative to the resonant frequency. If an additional impulse is applied in phase with the resonator beam motion, the amplitude of the motion is increased. If, however, the additional impulse is applied out of phase with the resonator beam motion, the amplitude of the motion will be decreased. Thus, the performance of the harvester is dependent upon the timing between the impulses applied to the system.

By way of example, the timing between impulses is particularly relevant to vibrational energy harvesters utilized in systems such as a tire pressure monitoring system (TPMS), where the harvester experiences impulses as the tire flexes during its rolling motion on the road. When a portion of the tread of the tire where the harvester is located contacts the road surface, that portion of the tire is forced into a short flat shape, which in turn results in a change in the acceleration profile for the harvester, which is attached to the perimeter of the tire. This change in the radial acceleration of the tire is explained in K. B. Singh et al., "Piezoelectric Vibration Energy Harvesting System With An Adaptive Frequency Tuning Mechanism For Intelligent Tires," Mechantronics 22:970-88 (2012), which is hereby incorporated by reference in its entirety.

For the majority of the tire's rotational period, there is a relatively constant centripetal acceleration for a portion of the tire located at the perimeter of the tire. When that portion of the tire initially contacts the road surface, there is an initial increase in radial acceleration. The initial increase in acceleration is then followed by an abrupt drop in radial acceleration to zero. The abrupt drop to zero provides a first impulse to the vibrational energy harvester, exciting motion of the resonator beam. The radial acceleration then remains at zero during the time it takes for the portion of the tire to rotate through its contact with the road surface. Once the portion of the tire rotates through its contact with the road surface, there is an abrupt positive enhancement in the radial acceleration, followed by a settling back to an equilibrium radial acceleration. The abrupt rise in radial acceleration back to or near equilibrium provides a second impulse to the vibrational energy harvester system. The second impulse will either enhance or suppress the vibration of the resonator beam excited by the first impulse, depending on the temporal width between the first and second pulses. The rotational speed of the tire and the circumference (or diameter) of the tire determine the temporal width. The vibration of the resonator beam, and thus the amount of energy harvested, can vary greatly depending on the speed of the vehicle. Therefore, it would be desirable to develop a piezoelectric energy harvester that provides a more consistent source of electrical energy in a system that is submitted to multiple impulses, such as in a TPMS.

The present invention is directed to overcoming these and other deficiencies in the art.

SUMMARY OF THE INVENTION

One aspect of the present invention relates to a device comprising a plurality of elongate resonator beams. Each of the resonator beams includes a piezoelectric material extending between first and second ends of the resonator beam. One or more bases are connected to the first end of each of the resonator beams, with the second end of the resonator beams being freely extending from the one or more bases as a cantilever. A mass is attached to each of the second ends of the resonator beams. Each of the resonator beams is tuned to a resonant frequency offset relative to each of the other resonator beams by $0.1/W$ to $0.9/W$, wherein W is a temporal width between a first impulse and a second impulse which excite motion of the resonator beams.

Another aspect of the present invention relates to a system comprising an electrically powered apparatus and the device of the present invention coupled to the apparatus.

Yet another aspect of the present invention relates to a tire comprising the system of the present invention.

A further aspect of the present invention relates to a method of powering an electrically powered apparatus. This method involves providing the system according to the present invention and subjecting the system to a plurality of impulses which cause the energy harvester device to generate electrical energy. Electrical energy is transferred to from the energy harvester device to the apparatus to provide power to the apparatus.

Another aspect of the present invention relates to a method for designing an energy harvesting device tuned to impulses encountered by a tire. The method involves determining the rotational period P of the tire at a given speed. A temporal width between a first impulse generated when a point on an outer circumference of the tire contacts a road surface and a second impulse generated when the point on the outer circumference of the tire is withdrawn from contact with the road surface at the determined rotational period P is determined. The system of the present invention is provided with a first resonator beam of the plurality of resonator beams tuned to a first resonant frequency that is an integer multiple M of the inverse of the temporal width W, wherein M is greater than or equal to 3, and a second resonator beam of the plurality of resonator beams tuned to a second resonant frequency offset relative to the first resonant frequency of the first resonator beam by 0.1/W to 0.9/W. The system is connected to the tire.

The energy harvester device of the present invention provides resonator beams that act as cantilevers with slightly offset resonant frequencies. The offset in resonant frequencies provides an energy harvester that yields a more consistent source of energy when the system is subjected to multiple impulses by limiting the effect of subsequent impulses on the overall average energy output from the harvester. In particular, the resonant frequencies are chosen in a manner such that, as one resonator beam experiences a decrease in motion due to improper phasing with respect to the received impulses, another resonator beam experiences increased motion due to favorable phasing of the received impulses. Additional resonator beams may be applied to provide further consistency in the amount of energy produced at different impulse rates. This device provides a more predictable and consistent source of energy for systems that receive multiple impulses at varying rates, which leads to better device performance.

BRIEF DESCRIPTION OF THE DRAWINGS

FIGS. 4A and 4B illustrate the attachment of the system directly to the tire (e.g., underneath the tire tread. FIG. 4C is a partial side view and partial block diagram of the system shown attached to the tire in FIGS. 4A and 4B.

DETAILED DESCRIPTION OF THE INVENTION

The present invention relates to a piezoelectric energy harvester device with frequency offset vibrational harvesters, a system comprising the device, and methods of using and designing the system. The energy harvester device of the present invention has improved energy harvesting consistency in systems that are subject to multiple impulses.

One aspect of the present invention relates to a device comprising a plurality of elongate resonator beams. Each of the resonator beams includes a piezoelectric material extending between first and second ends of the resonator beam. One or more bases are connected to the first end of each of the resonator beams, with the second end of the resonator beams being freely extending from the one or more bases as a cantilever. A mass is attached to each of the second ends of the resonator beams. Each of the resonator beams is tuned to a resonant frequency offset relative to each of the other resonator beams by 0.1/W to 0.9/W, where W is a temporal width between a first impulse and a second impulse which excite motion of the resonator beams.

Figure 1:
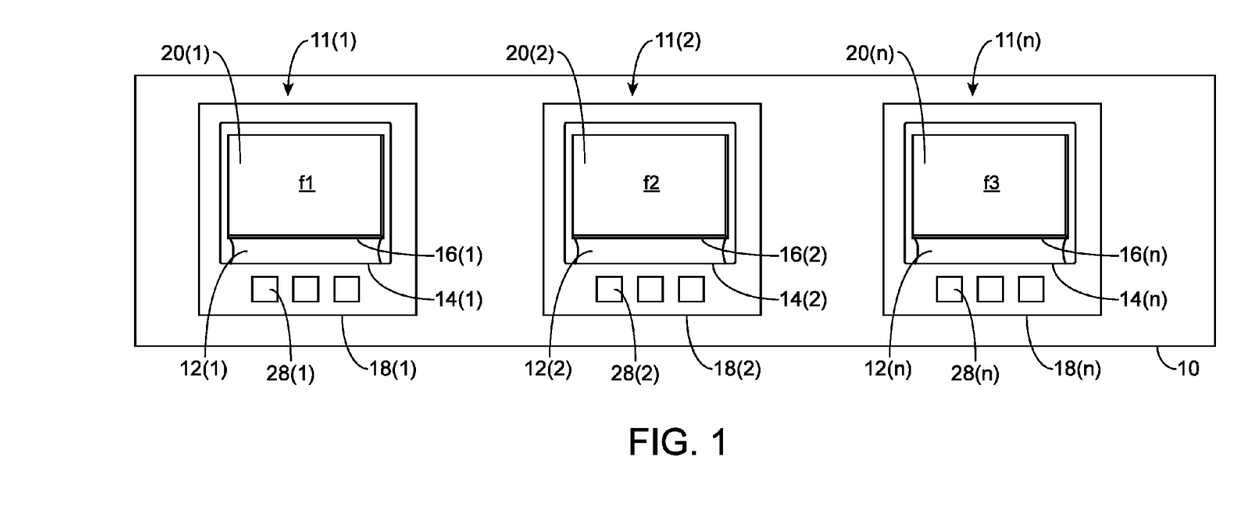
FIG. 1 is a top view of an embodiment of an energy harvester device of the present invention with a plurality of energy harvesters. Each of the plurality of energy harvesters includes an elongate resonator beam comprising a piezoelectric material, the resonator beam extending between first and second ends; a base connected to the resonator beam at the first end with the second end being freely extending from the base as a cantilever; and a mass attached to the second end of the resonator beam.

FIG. 1 is a top view of an embodiment of an energy harvester 10 device of the present invention including a plurality of energy harvesters 11(1)-11(n). Although energy harvesters 11(1)-11(n) are each shown located on separate, individual die, it is to be understood that two or more of energy harvesters 11(1)-11(n) could be co-located on a single die. The elements of energy harvesters 11(1)-11(n) will be described with respect to exemplary energy harvester 11(1) as each of the energy harvesters 11(1)-11(n) includes the same elements as will be described with respect to energy harvester 11(1), except that energy harvesters 11(1)-11(n) are tuned to operate at different resonant frequencies $f_1$-$f_n$. Resonant frequencies $f_1$-$f_n$ of energy harvesters 11(1)-11(n) are offset from one another as further described below.

Energy harvester 11(1) includes elongate resonator beam 12(1). Resonator beam extends between first end 14(1) and second end 16(1). First end 14(1) is connected to base 18(1) while second end 16(1) is freely extending from base 18(1) as a cantilever. Mass 20(1) is attached to second end 16(1) of resonator beams 12(1).

Energy harvester 11(1) may be formed in an integrated, self-packaged unit. In particular, as illustrated in FIG. 1, package 18(1), which also forms the base to which first end 16(1) of resonator beam 12(1) is attached, is shown to surround the cantilever structure (i.e., resonator beam 12(1) and mass 20(1)) so that it encloses (at least partially) the cantilever structure. In the present invention, the package can completely enclose the energy harvester device, or can be formed so as to vent the energy harvester device to the atmosphere. When it completely encloses the energy harvester device, the pressure within the enclosed package may be higher, equal to, or lower than atmospheric pressure. In one embodiment, the atmosphere in the enclosed package is less than atmospheric, for example, below 1 Torr.

Figure 2:
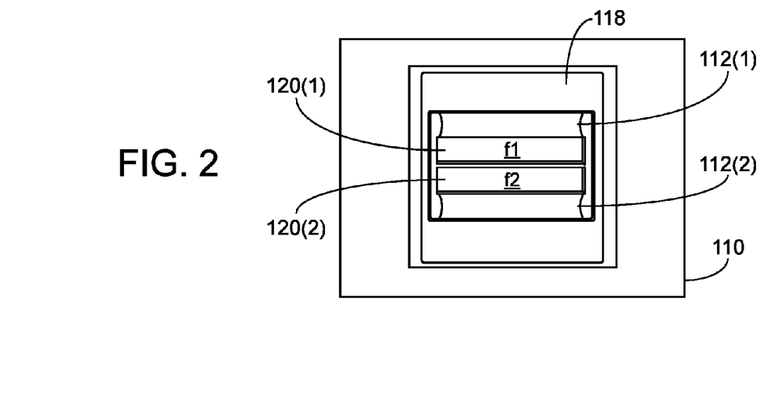
FIG. 2 is a top view of another embodiment of an energy harvester device of the present invention with an energy harvester comprising two elongate resonator beams comprising a piezoelectric material. The resonator beams are freely extending as cantilevers from a common base, with a separate mass attached at the freely extending end of both resonator beams.

In one embodiment, as shown in FIG. 2, energy harvester 110 includes package 118, which may include two separate cantilever structures freely extending from package 118 in opposite directions. Resonator beams 112(1) and 112(2) of the cantilever structures may be tuned to resonant frequencies that are slightly offset from one another as further described below. One or more of energy harvesters 11(1)-11(n) as shown in FIG. 1 may be replaced by energy harvester 110 shown in FIG. 2.

Referring again to FIG. 1, in one embodiment, package 18(1) may further comprise a compliant stopper connected to the package (e.g., on an inside wall of the package), where the stopper is configured to stabilize motion of the cantilever to prevent breakage. Suitable compliant stoppers according to this embodiment of the energy harvester device are illustrated and described in U.S. patent application Ser. No. 14/173,131 to Vaeth et al., which is hereby incorporated by reference in its entirety. The compliant stopper of the energy harvester device may be constructed of a variety of materials. The stopper may be made compliant through material choice, design, or both material choice and design. According to one embodiment, the stopper is made from a material integral to the package.

Suitable materials according to this embodiment may include, without limitation, glass, metal, silicon, oxides or nitrides from plasma-enhanced chemical vapor deposition (PECVD), or combinations thereof. According to another embodiment, the stopper is not integral to the package. Suitable materials for the stopper according to this embodiment may include, without limitation, glasses, metals, rubbers and other polymers, ceramics, foams, and combinations thereof. Other suitable materials for the compliant stopper include polymers with low water permeation, such as, but not limited to, cycloolefin polymers and liquid crystal polymers. Liquid crystal polymers can be injection molded.

In an alternative embodiment, resonator beam 12(1) may be configured to have a stopper feature which is configured to stabilize motion of the cantilever. Suitable stopper features according to this embodiment are illustrated in U.S. patent application Ser. No. 14/145,560 to Andosca et al., which is hereby incorporated by reference in its entirety. According to this embodiment, a stopper is formed on the mass and/or the second end of the resonator beam, and is configured to prevent contact between the second end of the resonator beam and the package.

Figure 3:
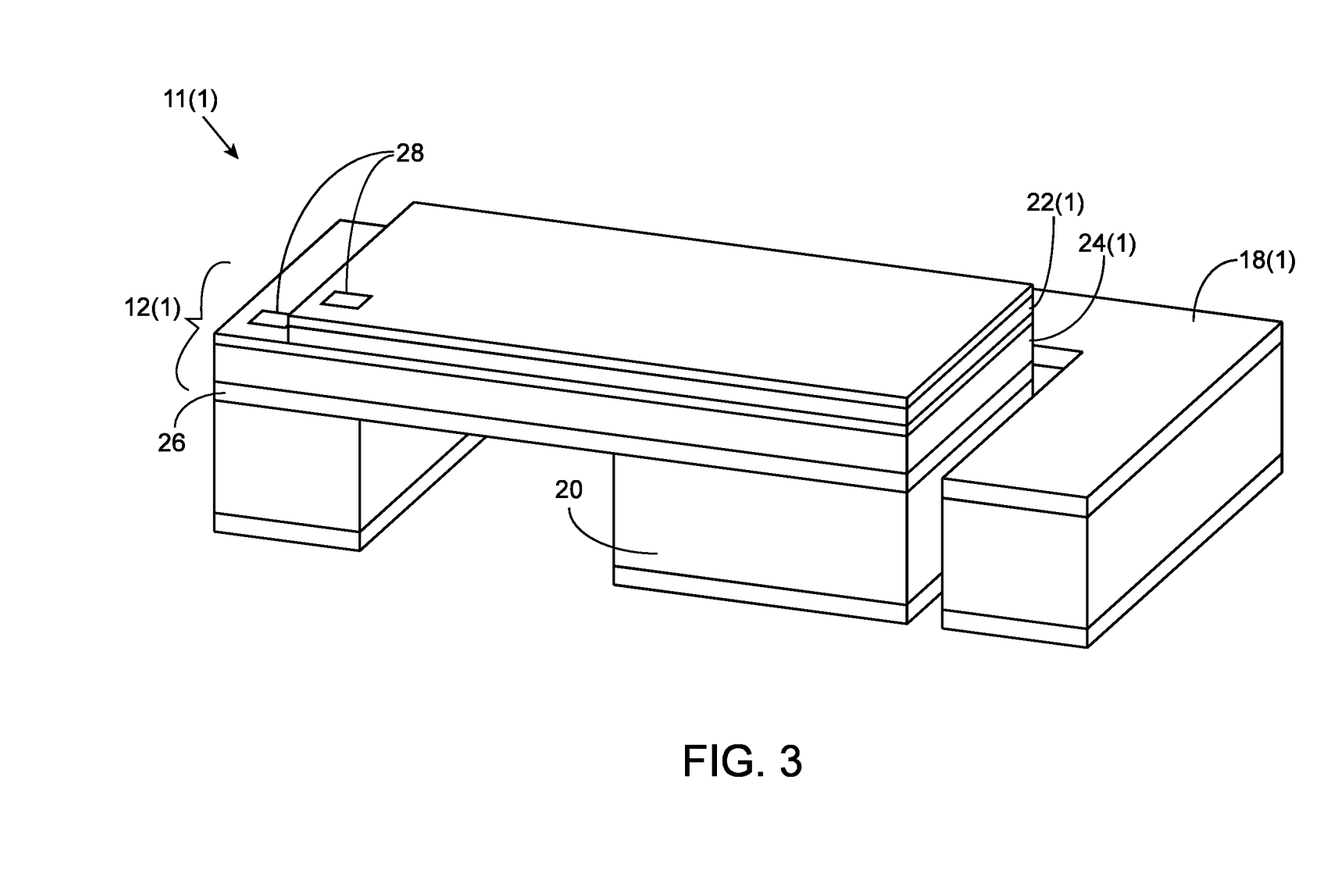
FIG. 3 is a perspective view of an exemplary single energy harvester of the present invention shown in FIG. 1.

FIG. 3 is a side cross-sectional view of an exemplary energy harvester 11(1), which is representative of energy harvesters 11(1)-11(n) shown in FIG. 1. According to one embodiment, resonator beam 12(1) comprises a laminate formed of a plurality of layers. Resonator beam 12(1) includes at least piezoelectric stack layer 22(1) over cantilever layer 24(1) on oxide layer 26(1), although resonator beam 12(1) may include other layers in other configurations. Non-limiting examples of other layers include those described in U.S. patent application Ser. No. 14/173,131 to Vaeth et al., which is hereby incorporated by reference in its entirety. In one particular embodiment, the plurality of layers comprises at least two different materials.

Cantilever layer 24(1) may be any suitable material such as silicon, polySi, metal (e.g., Cu or Ni), or other metal oxide semiconductor (CMOS) compatible material, or a high temperature polymer such as polymide. In one embodiment, cantilever layer 24(1) has a thickness range of about 10 µm to about 200 µm, about 10 µm to about 75 µm, or about 10 µm to about 50 µm. In one embodiment, cantilever layer 24(1) is a high Q resonator with a specific resonant frequency. Oxide layer 26(1), according to one embodiment, is a silicon layer with a thickness of about 1 µm.

Piezoelectric stack layer 22(1) of resonator beam 12(1) includes a piezoelectric material. Suitable piezoelectric materials include, without limitation, aluminum nitride, zinc oxide, polyvinylidene fluoride (PVDF), and lead zirconate titanate based compounds. Piezoelectric materials are materials that when subjected to mechanical strain become electrically polarized. The degree of polarization is proportional to the applied strain. Piezoelectric materials are widely known and available in many forms including single crystal (e.g., quartz), piezoceramic (e.g., lead zirconate titanate or PZT), thin film (e.g., sputtered zinc oxide), screen printable thick-films based upon piezoceramic powders (see, e.g., Baudry, "Screen-printing Piezoelectric Devices," *Proc. 6th European Microelectronics Conference* (London, UK) pp. 456-63 (1987) and White & Turner, "Thick-film Sensors: Past, Present and Future," *Meas. Sci. Technol.* 8:1-20 (1997), which are hereby incorporated by reference in their entirety), and polymeric materials such as polyvinylidenefluoride ("PVDF") (see, e.g., Lovinger, "Ferroelectric Polymers," *Science* 220:1115-21 (1983), which is hereby incorporated by reference in its entirety).

Piezoelectric materials typically exhibit anisotropic characteristics. Thus, the properties of the material differ depending upon the direction of forces and orientation of the polarization and electrodes. The level of piezoelectric activity of a material is defined by a series of constants used in conjunction with the axes of notation. The piezoelectric strain constant, d, can be defined as $$d = \frac{\text{strain developed}}{\text{applied field}} m/V$$

(Beeby et al., "Energy Harvesting Vibration Sources for Microsystems Applications," *Meas. Sci. Technol.* 17:R175-R195 (2006), which is hereby incorporated by reference in its entirety Piezoelectric stack layer 22(1) of resonator beam 12(1) also includes one or more electrodes 28(1) in electrical contact with piezoelectric stack layer 22(1). According to one embodiment, electrodes 28(1) comprise a material selected from the group consisting of molybdenum and platinum, although other materials suitable for forming electrode structures may also be used. In additional, energy harvester 11(1) may further include electrical harvesting circuitry in electrical connection with one or more electrodes 28(1) to harvest electrical energy from the piezoelectric material of resonator beam 12(1). As described in further detail below, the electrical harvesting circuitry can be electrically coupled to an electrically powered apparatus to provide power generated from the piezoelectric material and supplied to the apparatus.

In energy harvester 11(1), resonator beam 12(1) has second end 16(1), which is freely extending from base 18(1) as a cantilever. A cantilever structure comprising piezoelectric material is designed to operate in a bending mode thereby straining the piezoelectric material and generating a charge from the d effect (Beeby et al., "Energy Harvesting Vibration Sources for Microsystems Applications," *Meas. Sci. Technol.* 17:R175-R195 (2006), which is hereby incorporated by reference in its entirety). A cantilever provides low resonant frequencies, reduced further by the presence of mass 20(1) attached at second end 16(1) of resonator beam 12(1).

Resonator beam 12(1) may have sidewalls that take on a variety of shapes and configurations to help tune resonator beam 12(1) and to provide structural support. According to one embodiment, resonator beam 12(1) has sidewalls which are continuously curved within the plane of resonator beam 12(1), as described in U.S. patent application Ser. No. 14/145,534 to Vaeth et al., which is hereby incorporated by reference in its entirety.

Energy harvester 11(1) includes mass 20(1) at second end 16(1) of resonator beam 12(1). Mass 20(1) is provided to lower the frequency of resonator beam 12(1) and also to increase the power output of resonator beam 12(1) (i.e., generated by the piezoelectric material). Mass 20(1) may be constructed of a single material or multiple materials (e.g., layers of materials). According to one embodiment, mass 20(1) is formed of silicon wafer material. Other suitable materials include, without limitation, copper, gold, and nickel deposited by electroplating or thermal evaporation.

In one embodiment, a single mass 20(1) is provided per resonator beam 12(1). However, more than one mass may also be attached to resonator beam 12(1). In other embodiments, mass 20(1) is provided, for example, at differing locations along resonator beam 12.

One or more electrodes 28(1) output an electrical signal from the piezoelectric materials of resonator beam 12(1) as resonator beam 12(1) is subject to movement, such as an impulse motion applied to the energy harvester device 10(1). Accordingly, electrodes 28(1) are in electrical communication with the piezoelectric materials of resonator beam 12(1). Electrical energy collected from the piezoelectric materials of resonator beam 12(1) is then communicated to additional circuitry. In one embodiment, the additional circuitry is formed on device 10 at or near electrodes 28(1). In another embodiment, the circuitry may be a separate chip or board, or is present on a separate chip or board.

Referring again to FIG. 1, in the energy harvester device of the present invention, each of the energy harvesters 11(1)-11(n) in energy harvester device 10 includes resonator beam 12(1)-12(n) that is tuned to a respective resonant frequency $f_1$-$f_n$. As those skilled in the art will readily appreciate, resonator beam 12(1)-12(n) can be tuned by varying any one or more of a number of parameters, such as the cross-sectional shape of resonator beam 12(1)-12(n), cross-sectional dimensions of resonator beam 12(1)-12(n), the length of resonator beam 12(1)-12(n), the mass of mass 20(1)-20(n), the location of mass 20(1)-20(n) on resonator beam 12(1)-12(n), and the materials used to make resonator beam 12(1)-12(n).

The resonant frequencies of energy harvesters 11(1)-11(n) of the present invention in operation may include frequencies of about 50 Hz to about 4,000 Hz, about 100 Hz to about 3,000 Hz, about 100 Hz to about 2,000 Hz, or about 100 Hz to about 1,000 Hz. Each resonant frequency $f_1$-$f_n$ of energy harvesters 11(1)-11(n) is offset relative to the resonant frequencies of the other energy harvesters by 0.1/W to 0.9/W, where W is a temporal width between a first impulse and a second impulse which excite motion of resonator beams 12(1)-12(n), although the offset may be 0.2/W to 0.8/W, 0.3/W to 0.7/W, 0.4/W to 0.6/W, or 0.45/W to 0.55/W. The resonator beams 12(1)-12(n) are tuned to an offset in resonant frequencies such that one or more of the energy harvesters 11(1)-11(n) will experience the proper phasing with respect to the timing of the received impulses as will be described further below. The offset in resonant frequencies $f_1$-$f_n$ provides a consistent source of the output of the electrical signal from one or more electrodes 28(1) for impulses received at various different temporal widths W between impulses which excite motion of resonator beams 12(1)-12(n) of energy harvester device 10.

Energy harvesters 11(1)-11(n) of the energy harvester device of the present invention may be made in accordance with the methods set forth, e.g., in U.S. patent application Ser. No. 14/145,534 to Andosca & Vaeth; U.S. patent application Ser. No. 14/173,131 to Vaeth et al.; and U.S. patent application Ser. No. 14/201,293 to Andosca et al., which are hereby incorporated by reference in their entirety. For example, according to one embodiment, a method of producing an energy harvester device involves providing a silicon wafer having a first and second surface. A first silicon dioxide ($SiO_2$) layer is deposited on the first surface of the silicon wafer. A cantilever material is deposited on the first silicon dioxide layer. A second silicon dioxide layer is deposited on the cantilever material. A piezoelectric stack layer is deposited on the second silicon dioxide layer. The piezoelectric stack layer, the second silicon dioxide layer, the cantilever material, and the first silicon dioxide layer are patterned. The second surface of the silicon wafer is etched to produce the energy harvester device.

Another aspect of the present invention relates to a system comprising an apparatus and the device of the present invention. In one embodiment, the device is electrically coupled to the apparatus. Yet another aspect of the present invention relates to a tire comprising the system of the present invention.

For example, according to one embodiment, the system of the present invention is a wireless sensor device containing a sensor to monitor pressure in a tire, although the system of the present invention may be applied to wireless sensors to monitor, e.g., any one or more various environmental properties (temperature, humidity, light, sound, vibration, wind, movement, pressure, etc.). The energy harvester system of the present invention is coupled to the sensor to provide power to the sensor.

Figure 4A:
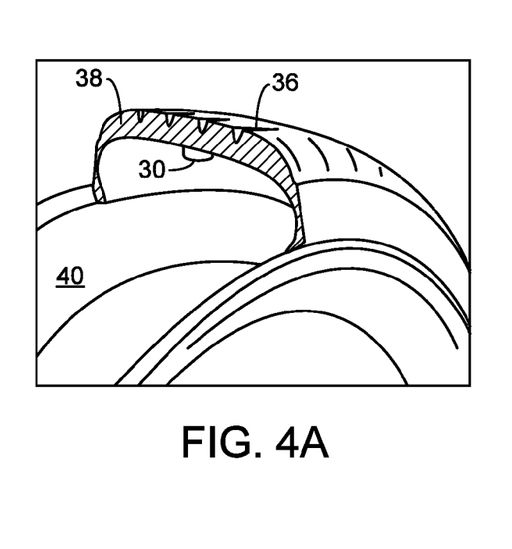
FIGS. 4A-4C illustrate an embodiment of a system of the present invention in which a tire pressure monitoring system is electrically coupled to the energy harvester device of the present invention to power the tire pressure monitoring system.
Figure 4B:
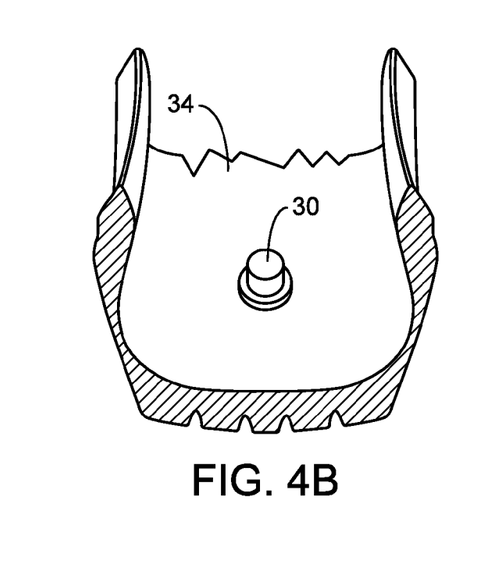
Figure 4C:
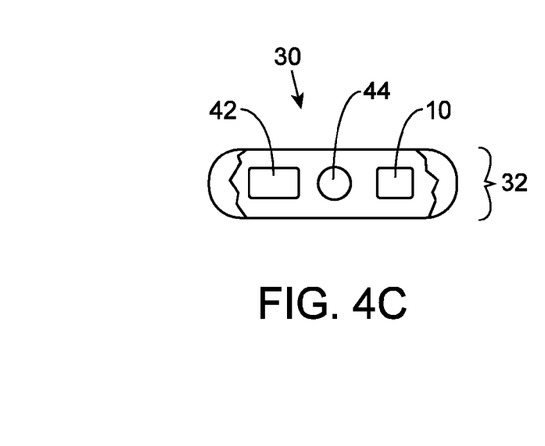

Turning now to FIGS. 4A-4C, according to one embodiment, the system of the present invention is a tire pressure monitoring system ("TPMS") 30, which includes housing 32, although the system of the present invention could be applied to other systems that are excited by impulse motion. TPMS 30 is coupled to tire 36 on the underside of tire 36 (i.e., under tire tread 38 and between tread 38 and wheel rim 40. In this embodiment, TPMS 30 includes sensor component 42 to monitor tire pressure, energy storage 44, and energy harvester device 10 of the present invention, all of which are in electrical communication and are located within housing 32. According to this embodiment, energy harvester device 10 provides a standalone source of energy to power sensor 42 of TPMS 30, which is used in place of, or in conjunction with, another standalone energy source. The energy harvester device of the present invention may also power an electrically powered apparatus by charging energy storage 44 associated with the electrically powered apparatus. Energy storage 44 may be a capacitor bank or a super-capacitor, although in other applications energy storage 44 may be a rechargeable battery. For example, the energy harvester device may provide a trickle charge to energy storage 44 which powers the electrically powered apparatus.

Figure 5A:
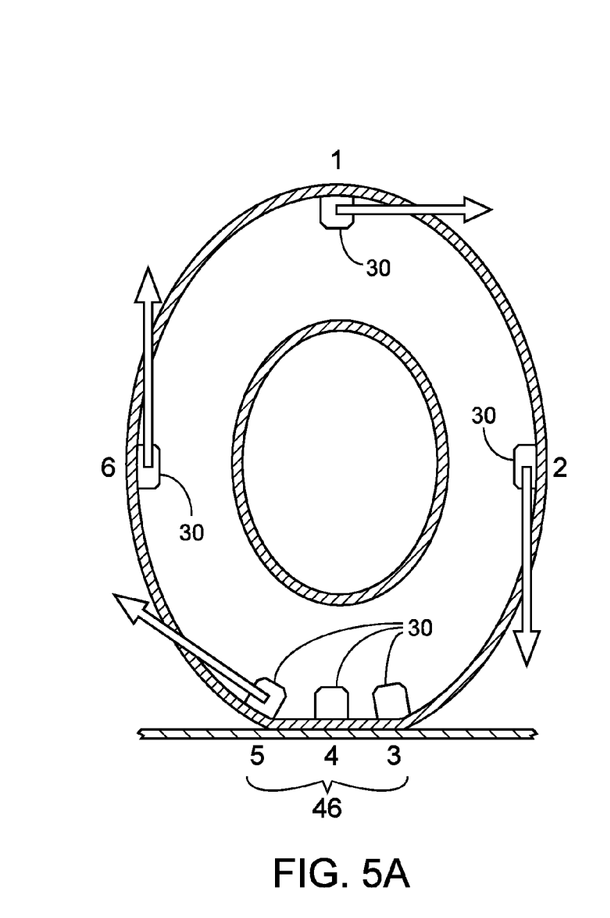
FIG. 5A illustrates the position of the system shown in FIGS. 4A-4C during the rotation of the tire.
Figure 5B:
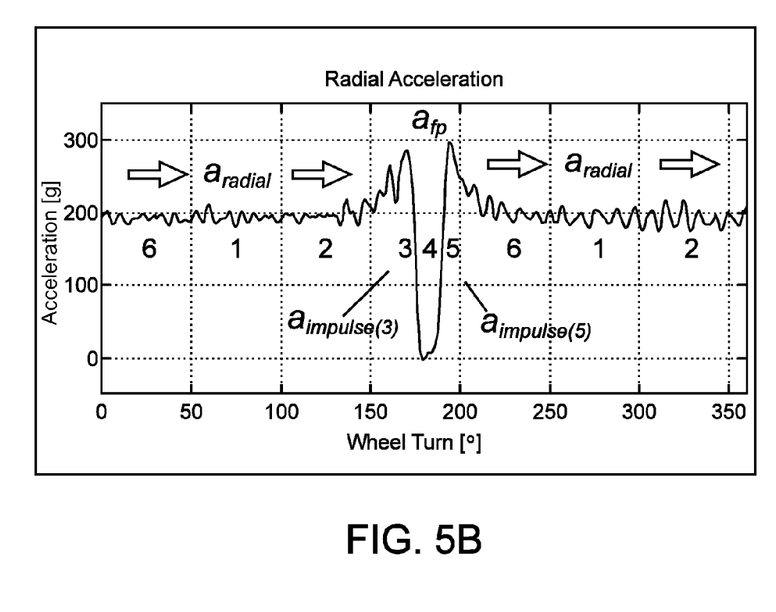
FIG. 5B illustrates a radial acceleration profile for the system at the various positions as illustrated in FIG. 5A.

TPMS 30 is mounted directly to tire 36 such that motion of resonator beams 12(1)-12(n) of energy harvester device 10 is excited as a result of impulses generated as tire 36 enters the footprint region of rotation (i.e., as tire 36 meets the road at the point where TPMS 30 is attached to tire 36). FIG. 5A shows the various positions (1-6) of TPMS 30 during rotation of tire 36 through a full 360 degree rotation of tire 36, including in footprint region 46. FIG. 5B shows an associated radial acceleration profile for TPMS 30 when attached to tire 36 throughout the rotation of tire 36, including the radial acceleration at positions 1-6.

TPMS 30 travels at an equilibrium radial acceleration outside of footprint region 46, i.e., at positions 1, 2, and 6. At position 3, the TPMS 30 enters footprint region 46 and experiences a sudden increase in radial acceleration, followed by a sudden decrease in radial acceleration to zero. The sudden decrease provides a first impulse to excite motion of resonator beams 12(1)-12(n) of energy harvester device 10. TPMS 30 remains at zero radial acceleration throughout footprint region 46, including at position 4. At position 5, TPMS 30 exits footprint region and experiences a sudden increase in radial acceleration before settling back to the equilibrium radial acceleration. The sudden increase at position 5 provides a second impulse to excite motion of resonator beams 12(1)-12(n) of energy harvester device. The temporal width or time duration (W) between the first impulse and the second impulse is determined by the rotational period (P) of tire 36, which is determined by the speed of the vehicle on which tire 36 is located.

In one example, energy harvester device 10 of TPMS 30 may include two energy harvesters 11(1) and 11(2) with corresponding resonant frequencies $f_1$ and $f_2$. In this example, resonant frequency $f_1$ of energy harvester 11(1) is tuned based on the temporal width W at a given speed, such that the resonant frequency $f_1$ is defined by the equation $f_1 = n/W$, wherein n is a positive integer. In one example, n>4, although higher values of n may be utilized to provide optimal power generation based on the characteristics of the energy harvester 11(1), such as size by way of example. Energy harvester 11(1) may be tuned to resonant frequency $f_1$ using methods known in the art. By way of example, resonator beam 12(1) can be tuned by varying any one or more of a number of parameters, such as the cross-sectional shape of resonator beam 12(1), cross-sectional dimensions of resonator beam 12(1), the length of resonator beam 12(1), the mass of mass 20(1), the location of mass 20(1) on resonator beam 12(1), and the materials used to make resonator beam 12(1).

In this example, energy harvester 11(2) is tuned to resonant frequency $f_2$, which is slightly offset from resonant frequency $f_1$. In this example, the offset between $f_1$ and $f_2$ is 0.1/W to 0.9/W, i.e., the absolute value of $f_1$-$f_2$ is equal to 0.1/W to 0.9W, although the offset may be 0.2/W to 0.8/W, 0.3/W to 0.7/W, 0.4/W to 0.6/W, or 0.45/W to 0.55/W. Energy harvester 11(2) may be tuned to resonant frequency $f_2$ using methods known in the art. By way of example, resonator beam 12(2) can be tuned by varying any one or more of a number of parameters, such as the cross-sectional shape of resonator beam 12(2), cross-sectional dimensions of resonator beam 12(2), the length of resonator beam 12(2), the mass of mass 20(2), the location of mass 20(2) on resonator beam 12(2), and the materials used to make resonator beam 12(2).

In operation, motion of resonant beams 12(1) and 12(2) of energy harvesters 11(1) and 11(2) is excited by the first impulse received when TPMS 30 enters footprint region 46 at position 3, as shown in FIG. 5A. The second impulse is received when TPMS 30 footprint region 46 at position 5. The first impulse and second impulse are separated by temporal width W. Resonant beam 12(1) vibrates with a period of $T_1=1/f_1$, while resonant beam 12(2) vibrates with a period of $T_2=1/f_2$. In the event that temporal width W is approximately an integer multiple of either $T_1$ or $T_2$, the motion of the associated energy harvester will be out of phase for the second impulse. This is because the second impulse is a sharp increase in acceleration, while the first impulse is a sharp reduction in acceleration. Therefore, this harvester will be degraded. However, if the temporal width W is an integer n+/−½ times the period of either $T_1$ or $T_2$, the motion of the associated energy harvester will be enhanced. The offset between $f_1$ and $f_2$ ensures that, when one energy harvester is slightly out of phase with the temporal width W, the other energy harvester is likely to be in phase, in order to make the power output from the energy harvester device 10 more even at various values for temporal width W. Although this example utilizes two energy harvesters, it is to be understood that additional energy harvesters with offset resonant frequencies may be utilized to provide a more uniform source of power at various speeds. In one example, the additional energy harvesters include resonator beams with resonant frequencies that are offset relative to each of the other resonator beams in the plurality of resonator beams by 0.1/W to 0.9/W, although the offset may be 0.2/W to 0.8/W, 0.3/W to 0.7/W, 0.4/W to 0.6/W, or 0.45/W to 0.55/W.

A further aspect of the present invention relates to a method of powering an electrically powered apparatus. This method involves providing the energy harvester system of the present invention. The energy harvester is subjected to a plurality of impulses to generate electrical energy from the piezoelectric material. The electrical energy is transferred from the piezoelectric material to electrically powered apparatus to provide power to the apparatus. In one example, the method is carried out in conjunction with a vehicle tire in use and said apparatus is a tire pressure monitoring system or a component of a tire pressure monitoring system as described above.

Another aspect of the present invention relates to a method for designing an energy harvesting device tuned to impulses encountered by a tire. The method involves determining the rotational period P of the tire at a given speed. A temporal width between a first impulse generated when a point on an outer circumference of the tire contacts a road surface and a second impulse generated when the point on the outer circumference of the tire is withdrawn from contact with the road surface at the determined rotational period P is determined. The system of the present invention is provided with a first resonator beam of the plurality of resonator beams tuned to a first resonant frequency that is an integer multiple M of the inverse of the temporal width W, wherein M is greater than or equal to 3, and a second resonator beam of the plurality of resonator beams tuned to a second resonant frequency offset relative to the first resonant frequency of the first resonator beam by 0.1/W to 0.9/W. The system is connected to the tire.

Referring to FIGS. 1-5B, an exemplary method for designing energy harvesting device 10, which is tuned to impulses encountered by tire 36 is described. The rotational period P of tire 36 at a given speed is determined. The rotational speed and tire diameter (or circumference) may then be utilized to determine the temporal width W between a first impulse generated when a point on the outer circumference of tire 36 contacts a road surface, as shown in position 3 in FIG. 5A, and a second impulse generated when the point on the outer circumference of tire 36 is withdrawn from contact with the road surface, as shown in position 5 in FIG. 5A. The temporal width W is dependent on the rotational period P, such that the value of P/W remains fairly constant at various vehicle speeds.

Next, TPMS 30 of the present invention is provided with resonator beams 12(1)-12(n) comprising a piezoelectric material. Resonator beams 12(1)-12(n) are freely extending from bases 18(1)-18(n) as cantilevers. An exemplary resonator beam 12(1) is illustrated in FIG. 3. Resonator beams 12(1)-12(n) may be located on the same die as illustrated, by way of example only, in FIG. 2, or may be located separately within energy harvester device 10, as individual harvesters 11(1)-11(n), as illustrated in FIG. 1.

First resonator beam 12(1) is tuned to first resonant frequency $f_1$ that is an integer multiple M of the inverse of the temporal width W of tire 36 at a given speed. In one example, M is greater than or equal to 3, although different values of M may be utilized depending on the desired performance characteristics of TPMS 30. First resonator beam 12(1) may be tuned to resonant frequency $f_1=M/W$ using methods known in the art. By way of example, first resonator beam 12(1) can be tuned by varying any one or more of a number of parameters, such as the cross-sectional shape of first resonator beam 12(1), cross-sectional dimensions of first resonator beam 12(1), the length of first resonator beam 12(1), the mass of mass 20(1) attached to the end of first resonator beam 12(1), the location of the mass 20(1) on first resonator beam 12(1), and the materials used to make first resonator beam 12(1).

Second resonator beam 12(2) is then tuned to second resonant frequency $f_2$ which is offset relative to first resonant frequency $f_1$ of first resonator beam 12(1) by 0.1/W to 0.9/W, although the offset may be 0.2/W to 0.8/W, 0.3/W to 0.7/W, 0.4/W to 0.6/W, or 0.45/W to 0.55/W. Second resonator beam 12(2) may be tuned to resonant frequency $f_2$ using methods known in the art. By way of example, second resonator beam 12(2) can be tuned by varying any one or more of a number of parameters, such as the cross-sectional shape of second resonator beam 12(2), cross-sectional dimensions of second resonator beam 12(2), the length of second resonator beam 12(2), the mass of mass 20(2) attached to the end of second resonator beam 12(2), the location of mass 20(2) on second resonator beam 12(2), and the materials used to make second resonator beam 12(2).

TPMS 30 may include additional harvesters with resonator beams tuned to an offset from the other resonator beams by an offset of 0.1/W to 0.9/W relative to resonator beams 12(1)-12(n). In one example, third resonator beam 12(3) may have resonant frequency $f_3$ offset from resonant frequency $f_1$ of first resonant beam 12(1) by 0.25/W to 0.75/W, while fourth resonator beam 12(4) may have resonant frequency $f_4$ offset from resonant frequency $f_2$ of second resonator beam 12(2) by 0.25/W to 0.75/W, although additional number of resonator beams with other offsets may be utilized. Additionally, the method may include determining the rotational period of tire 36 at another given speed and tuning the resonant frequency of two or more resonator beams with a frequency interval based on the rotational period P of tire 36 at the another given speed. The additional resonator beams will provide a more consistent source of power to the system when subjected to impulse motion at various different speeds.

EXAMPLES

The following examples are provided to illustrate embodiments of the present invention but are by no means intended to limit its scope.

Example 1

Power Output of a Device with Two Energy Harvesters with a Resonant Frequency Offset of 0.635/W, with W=8.45 ms A system was constructed to provide impulses to one or more harvesters at delay intervals between a first and second impulse, or an impulse pair, similar to that experienced by a rolling tire. This system was operated at various repeat rates of these impulse pairs and the output power of the harvesters was monitored. Using a temporal width W of 8.45 ms as a reference point, the system was loaded with a vibrational energy harvester with a resonant frequency of 581 Hz. Over an operating frequency of 7 to 10 Hz (equivalent to a rotational period of 143 ms to 100 ms), the average power produced was 4.3 uW, with almost no average power being produced at 7 and 8.5 Hz rotational frequency.

Figure 6:
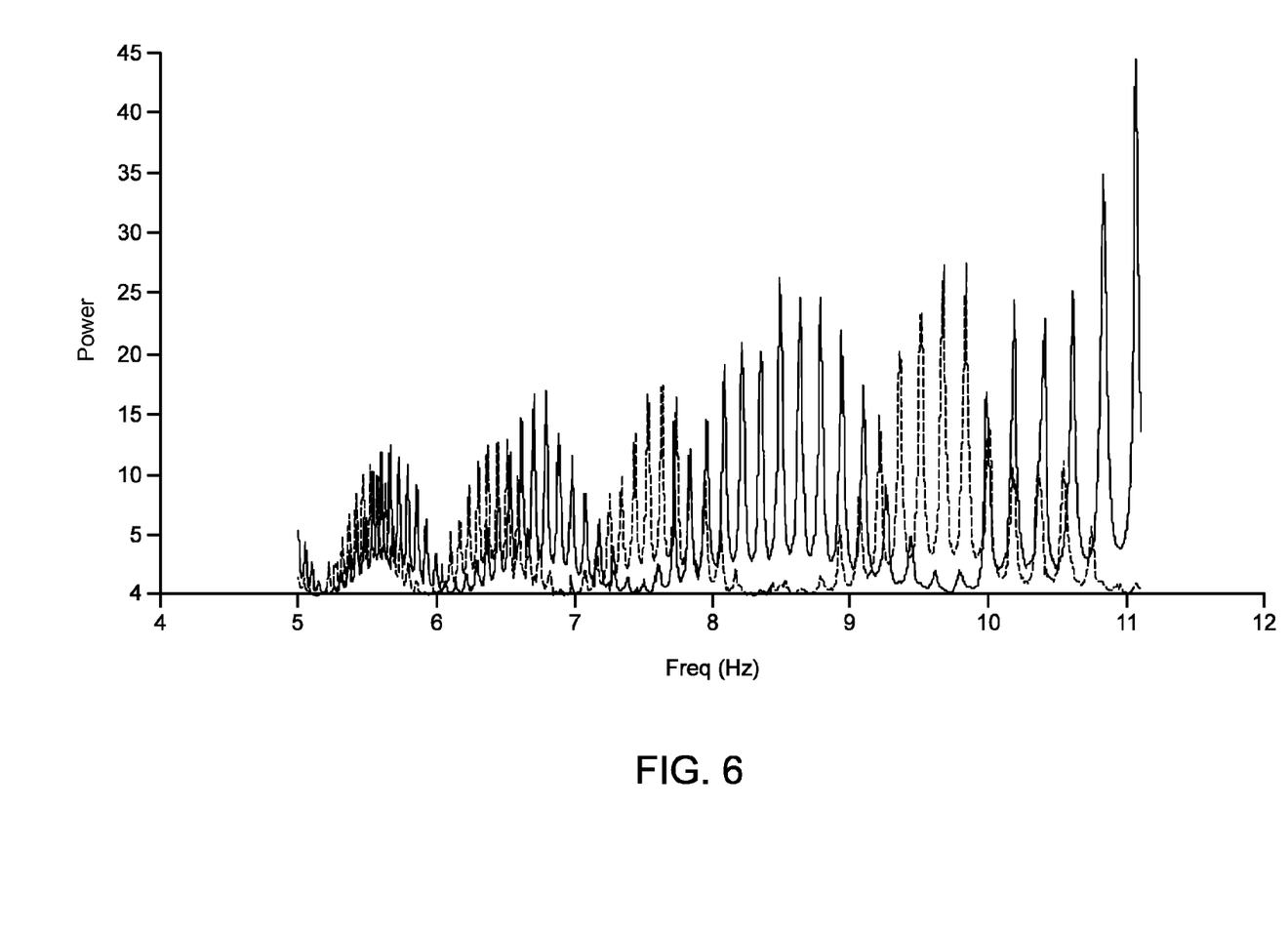
FIG. 6 is a graph illustrating the power output of an energy harvester device with two energy harvesters with a resonant frequency offset of 0.635/W with W approximately equal to 8.45 ms.

The system was then fitted with a vibrational energy harvester with a resonant frequency of 581 Hz and a second vibrational energy harvester with a resonant frequency of 506 Hz, representing a 75 Hz difference in harvester resonant frequencies, (or 0.635/W, with W=8.45 ms as a reference point) offset between the two frequencies. Referring to FIG. 6, the dashed line shows the power output for the energy harvester with a resonant frequency of 581 Hz, while the solid line shows the power output for the energy harvester with a resonant frequency of 506 Hz. The use of two energy harvesters with the frequency offset of 0.635/W in the system provides a more even power output from the system. The average power produced from this system over the operating frequency of 7 to 10 Hz (equivalent to a rotational period of 143 ms to 100 ms) was 9.9 uW, with no bands of zero average power production.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. An energy harvester device comprising:
   a plurality of elongate resonator beams, wherein each of the plurality of resonator beams comprise a piezoelectric material extending between first and second ends;
   one or more bases connected to the first ends of each of the plurality of resonator beams with each of the second ends of the plurality of resonator beams being freely extending from said one or more bases as a cantilever; and
   a mass attached to each of the second ends, wherein each of the plurality of resonator beams is tuned to a resonant frequency offset relative to each of the other resonator beams in the plurality of resonator beams by 0.1/W to 0.9/W, where W is a temporal width between a first impulse and a second impulse which excite motion of the plurality of resonator beams.

2. The energy harvester device according to claim 1, wherein the offset is 0.2/W to 0.8/W.

3. The energy harvester device according to claim 1, wherein the offset is 0.3/W to 0.7/W.

4. The energy harvester device according to claim 1, wherein the offset is 0.4/W to 0.6/W.

5. The energy harvester device according to claim 1, wherein the offset is 0.45/W to 0.55/W.

6. The energy harvester device according to claim 1, wherein each of said plurality of resonator beams comprises a laminate formed of different layers.

7. The energy harvester device according to claim 6, wherein said different layers comprise different materials.

8. The energy harvester device according to claim 1, wherein each of said plurality of resonator beams further comprises:
   one or more electrodes in electrical contact with said piezoelectric material.

9. The energy harvester device according to claim 8, wherein the one or more electrodes comprises a material selected from the group consisting of molybdenum and platinum.

10. The energy harvester device according to claim 8, wherein each of said plurality of resonator beams further comprises:
    electrical harvesting circuitry in electrical communication with the one or more electrodes to harvest electrical energy from said piezoelectric material.

11. The energy harvester device according to claim 1, wherein the piezoelectric material is selected from the group consisting of aluminum nitride, zinc oxide, polyvinylidene fluoride, and lead zirconate titanate compounds.

12. A system comprising:
    an electrically powered apparatus; and
    the energy harvester device according to claim 1 electrically coupled to the apparatus.

13. The system according to claim 12, wherein said electrically powered apparatus is a tire pressure monitoring system or a component of a tire pressure monitoring system.

14. A tire comprising the system according to claim 13.

15. The system according to claim 12, wherein the offset is 0.2/W to 0.8/W.

16. The system according to claim 12, wherein the offset is 0.3/W to 0.7/W.

17. The system according to claim 12, wherein the offset is 0.4/W to 0.6/W.

18. The system according to claim 12, wherein the offset is 0.45/W to 0.55/W.

19. The system according to claim 12, wherein each of said plurality of resonator beams comprises a laminate formed of different layers.

20. The system according to claim 19, wherein said different layers comprise different materials.

21. The system according to claim 12, wherein each of said plurality of resonator beams further comprises:
one or more electrodes in electrical contact with said piezoelectric material.

22. The system according to claim 21, wherein the one or more electrodes comprises a material selected from the group consisting of molybdenum and platinum.

23. The system according to claim 21, wherein each of said plurality of resonator beams further comprises:
electrical harvesting circuitry in electrical communication with the one or more electrodes to harvest electrical energy from said piezoelectric material.

24. The system according to claim 12, wherein the piezoelectric material is selected from the group consisting of aluminum nitride, zinc oxide, polyvinylidene fluoride, and lead zirconate titanate compounds.

25. A method of powering an electrically powered apparatus, said method comprising:
providing the system according to claim 12;
subjecting the system to a plurality of impulses, whereby said energy harvester device generates electrical energy; and
transferring said electrical energy generated by said energy harvester device to said apparatus to provide power to the apparatus.

26. The method according to claim 25, wherein said method is carried out in conjunction with a vehicle tire in use and said apparatus is a tire pressure monitoring system or a component of a tire pressure monitoring system.

27. The method according to claim 25, wherein each of said plurality of resonator beams further comprises:
one or more electrodes in electrical contact with said piezoelectric material.

28. The method according to claim 27, wherein each of said plurality of resonator beams further comprises:
electrical harvesting circuitry in electrical communication with the one or more electrodes to harvest electrical energy from said piezoelectric material.

29. A method of designing an energy harvesting device tuned to impulses encountered by a tire, said method comprising:
determining the rotational period P of the tire at a given speed;
determining a temporal width W between a first impulse generated when a point on an outer circumference of the tire contacts a road surface and a second impulse generated when the point on the outer circumference of the tire is withdrawn from contact with the road surface at the determined rotational period P;
providing the system according to claim 13;
tuning a first resonator beam of the plurality of resonator beams to a first resonant frequency that is an integer multiple M of the inverse of the temporal width W, wherein M is greater than or equal to 3;
tuning a second resonator beam of the plurality of resonator beams to a second resonant frequency offset relative to the first resonant frequency of the first resonator beam by 0.1/W to 0.9/W; and
connecting the system to the tire.

30. The method according to claim 29 further comprising:
tuning a third resonator beam of the plurality of resonator beams to a third resonant frequency that is offset from the other resonator beams by a frequency interval of 0.1/W to 0.9W.

31. The method according to claim 29, wherein the offset in resonant frequency between different resonator beams is 0.2/W to 0.8/W.

32. The method according to claim 29, wherein the offset in resonant frequency between different resonator beams is 0.3/W to 0.7/W.

33. The method according to claim 29, wherein the offset in resonant frequency between different resonator beams is 0.4/W to 0.6/W.

34. The method according to claim 29, wherein the offset in resonant frequency between different resonator beams is 0.45/W to 0.55/W.

35. The method according to claim 29, wherein each of said plurality of resonator beams further comprises:
one or more electrodes in electrical communication with said piezoelectric material.

36. The method according to claim 35, wherein each of said plurality of resonator beams further comprises:
electrical harvesting circuitry in electrical communication with the one or more electrodes to harvest electrical energy from said piezoelectric material.

37. The method according to claim 29, wherein the system comprises three resonator beams, the method further comprising:
tuning a third resonant beam to a third resonant frequency, wherein a frequency interval between the first resonant frequency and the third resonant frequency is 0.25/W to 0.75/W.

38. The method according to claim 37, wherein the system comprises four resonator beams, the method further comprising:
tuning a fourth resonator beam to a fourth resonant frequency, wherein a frequency interval between the second resonant frequency and the fourth resonant frequency is 0.25/W to 0.75/W.

39. The method according to claim 29 further comprising:
determining the rotational period of the tire at another given speed; and
tuning the resonant frequency of two or more resonator beams with a frequency interval based on the rotational period of the tire at the another given speed.

* * * * *